US012740256B2

(12) United States Patent
Choi et al.

(10) Patent No.: US 12,740,256 B2
(45) Date of Patent: Sep. 15, 2026

(54) DISPLAY DEVICE

(71) Applicant: Samsung Display Co., LTD., Yongin-si (KR)

(72) Inventors: Jonghyun Choi, Yongin-si (KR); Youn Joon Kim, Yongin-si (KR); Minjeong Oh, Yongin-si (KR); Jinho Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 429 days.

(21) Appl. No.: 18/454,732

(22) Filed: Aug. 23, 2023

(65) Prior Publication Data

US 2024/0224621 A1 Jul. 4, 2024

(30) Foreign Application Priority Data

Jan. 3, 2023 (KR) .......................... 10-2023-000858

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
CPC ....................... H10K 2102/311; H10K 59/124
See application file for complete search history.

(56) References Cited

U.S. PATENT DOCUMENTS 10,586,841 B2 * 3/2020 Moon ................ H10K 59/1213
10,868,096 B2 12/2020 Park et al.
11,394,006 B2 * 7/2022 Choi ....................... F03D 7/042
11,482,580 B2 10/2022 Song et al.
2016/0043153 A1 * 2/2016 Min .................... H10K 59/131 257/40
2016/0118451 A1 * 4/2016 Youn .................. H10D 30/6704 257/66
2016/0204138 A1 * 7/2016 Park ..................... H10D 86/443 438/623
2019/0189718 A1 * 6/2019 Lee ...................... H10K 59/131

(Continued)

FOREIGN PATENT DOCUMENTS

CN 109671761 A 4/2019
CN 110690226 A 6/2021

(Continued)

*Primary Examiner* — Evren Seven
(74) *Attorney, Agent, or Firm* — Womble Bond Dickinson (US) LLP

(57) ABSTRACT

A display device includes a substrate having a first pixel area, a second pixel area offset from the first pixel area, a third pixel area offset from the second pixel area and a fourth pixel area offset from the third pixel area, and having a first sub valley area between the first pixel area and the second pixel area, a second sub valley area between the third pixel area and the fourth pixel area, and a main valley area between the second pixel area and the third pixel area; an inorganic insulating layer on the substrate and defining a first groove, a third groove, and a second groove respectively overlapping the first sub valley area, the second sub valley area, and the main valley area; and an organic insulating layer on the inorganic insulating layer and filling the first groove, the second groove and the third groove.

20 Claims, 7 Drawing Sheets

(56) References Cited

U.S. PATENT DOCUMENTS

| | | | | |
|---|---|---|---|---|
| 2020/0303479 | A1* | 9/2020 | Kim | H10K 59/1216 |
| 2022/0045137 | A1* | 2/2022 | Bae | H10K 59/353 |
| 2022/0093705 | A1* | 3/2022 | Kim | H10D 86/451 |
| 2022/0181575 | A1* | 6/2022 | Yun | H10K 59/131 |
| 2023/0052358 | A1* | 2/2023 | Song | H10K 59/124 |
| 2023/0320133 | A1* | 10/2023 | Choi | H10K 71/00 |
| 2023/0371318 | A1* | 11/2023 | Choi | H10K 59/124 |
| 2023/0389365 | A1* | 11/2023 | Chung | H10K 59/873 |

FOREIGN PATENT DOCUMENTS

| | | |
|---|---|---|
| KR | 10-2019-0104091 | 9/2019 |
| KR | 10-2021-0084733 | 7/2021 |
| KR | 10-2023-0010109 | 1/2023 |

* cited by examiner

FIG. 2

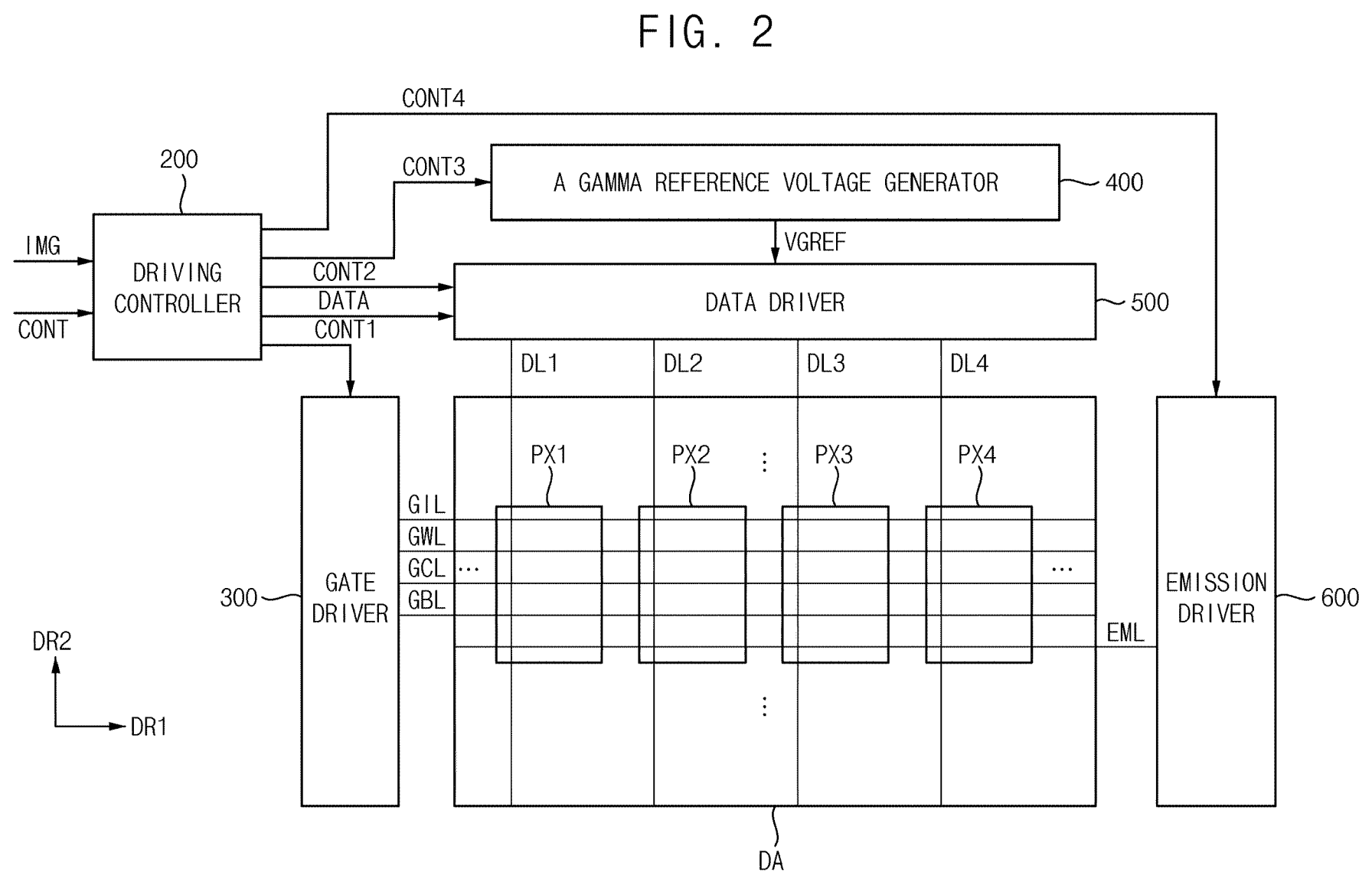

IMG
CONT
200
DRIVING CONTROLLER
CONT4
CONT3
CONT2
DATA
CONT1
400
A GAMMA REFERENCE VOLTAGE GENERATOR
VGREF
500
DATA DRIVER
DL1
DL2
DL3
DL4
PX1
PX2
PX3
PX4
DA
300
GATE DRIVER
GIL
GWL
GCL
GBL
600
EMISSION DRIVER
EML
DR1
DR2

T3:T3-1,T3-2
T4:T4-1,T4-2

DD
CE
PDL
VIA2
VIA1
CNT2
43
44
ILD2
34
OP3
33
ILD1
GI
BUF
BAR
SUB
I'
I
PX4
PX3
PX2
PX1
SV2
SV1
MV
PE4
EML4
PE3
EML3
PE2
EML2
PE1
EML1
50
24
14
13
23
ES
OP2
12
22
CNT1
42
41
31
OP1
32
21
11
DR1
DR3

DD
I
I'
PX1
SV1
PX2
MV
PX3
SV2
PX4
CE
PDL
VIA2
VIA1
CNT2
43
44
ILD2
34
OP3
33
ILD1
GI
BUF
BAR
SUB
PE1
EML1
PE2
EML2
50
PE3
EML3
PE4
EML4
W1
W2
W3
24
14
13
23
ES
OP2
12
22
CNT1
42
41
31
OP1
32
21
11
DR1
DR3

DISPLAY DEVICE

CROSS-REFERENCE TO RELATED APPLICATION

This application claims priority to and benefit of Korean Patent Application No. 10-2023-0000858, filed on Jan. 3, 2023, in the Korean Intellectual Property Office (KIPO), the entire content of which is incorporated herein by reference.

BACKGROUND

1. Field

Aspects of the present disclosure relate to a display device.

2. Description of the Related Art

The display device is a device that displays an image for providing visual information to a user. Among display devices, an organic light emitting diode display has recently attracted much attention.

The display device may be quite fragile, and when an external force is applied to the display device, a crack may occur inside the display device. If a crack occurs in a pixel area of the display device, or if a crack propagates to the pixel area, a transistor and/or a light emitting layer disposed in the pixel area may be damaged.

The above information disclosed in this Background section is only for enhancement of understanding of the background of the invention and therefore it may contain information that does not form the prior art.

SUMMARY

Aspects of embodiments of the present disclosure are directed to a display device with improved quality.

According to some embodiments of the present disclosure, there is provided a display device including: a substrate including a plurality of pixel areas including a first pixel area, a second pixel area offset from the first pixel area, a third pixel area offset from the second pixel area, and a fourth pixel area offset from the third pixel area, a first sub valley area between the first pixel area and the second pixel area, a second sub valley area between the third pixel area and the fourth pixel area, and a main valley area between the second pixel area and the third pixel area; an inorganic insulating layer on the substrate and defining a first groove, a third groove, and a second groove respectively overlapping the first sub valley area, the second sub valley area, and the main valley area, a depth of the second groove being different from a depth of the first groove; and an organic insulating layer on the inorganic insulating layer and filling the first groove, the second groove and the third groove.

In some embodiments, the inorganic insulating layer includes a barrier layer, a buffer layer on the barrier layer, a gate insulating layer on the buffer layer, a first interlayer insulating layer on the gate insulating layer, and a second interlayer insulating layer on the first interlayer insulating layer.

In some embodiments, the first groove and the third groove penetrate the second interlayer insulating layer, and wherein the second groove penetrates the second interlayer insulating layer, the first interlayer insulating layer, and the gate insulating layer.

In some embodiments, the second groove further penetrates the buffer layer.

In some embodiments, the first groove and the third groove further penetrate at least a portion of the first interlayer insulating layer, and the second groove further penetrates at least a portion of the barrier layer.

In some embodiments, the display device further comprises: a first gate electrode on the gate insulating layer and overlapping the first pixel area; a second gate electrode on the gate insulating layer, overlapping the second pixel area, and connected to the first gate electrode; a third gate electrode on the gate insulating layer and overlapping the third pixel area; a fourth gate electrode on the gate insulating layer, overlapping the fourth pixel area, and connected to the third gate electrode; a fifth gate electrode on the first interlayer insulating layer and overlapping the first pixel area; a sixth gate electrode on the first interlayer insulating layer and overlapping the second pixel area; a seventh gate electrode on the first interlayer insulating layer and overlapping the third pixel area; and an eighth gate electrode on the first interlayer insulating layer and overlapping the fourth pixel area.

In some embodiments, the display device further comprises: a first conductive layer on the second interlayer insulating layer and overlapping the first pixel area; a second conductive layer on the second interlayer insulating layer and overlapping the second pixel area; a fifth conductive layer on the organic insulating layer, overlapping the main valley area, and connected to the second conductive layer through a first contact hole penetrating the organic insulating layer; a third conductive layer on the second interlayer insulating layer and overlapping the second pixel area; a third conductive layer on the second interlayer insulating layer, overlapping the third pixel area, and connected to the fifth conductive layer through a second contact hole penetrating the organic insulating layer; and a fourth conductive layer on the second interlayer insulating layer and overlapping the fourth pixel area.

In some embodiments, a width of the second groove is greater than a width of the first groove and a width of the third groove.

In some embodiments, the second groove is to surround at least a portion of the plurality of pixel areas.

In some embodiments, each of the inorganic insulating layer and the organic insulating layer is continuously formed over the plurality of pixel areas.

According to some embodiments of the present disclosure, there is provided a display device comprising: a substrate comprising a plurality of pixel areas comprising a first pixel area, a second pixel area offset from the first pixel area, a third pixel area offset from the second pixel area and a fourth pixel area offset from the third pixel area, a first sub valley area between the first pixel area and the second pixel area, a second sub valley area between the third pixel area and the fourth pixel area, and a main valley area between the second pixel area and the third pixel area; an inorganic insulating layer on the substrate and defining a first groove, a third groove, and a second groove respectively overlapping the first sub valley area, the second sub valley area, and the main valley area, a depth of the second groove being different from a depth of the first groove; an organic insulating layer on the inorganic insulating layer and filling the first groove, the second groove and the third groove; and an etching prevention layer on a bottom surface of the second groove.

In some embodiments, the inorganic insulating layer includes a barrier layer, a buffer layer on the barrier layer, a gate insulating layer on the buffer layer, a first interlayer insulating layer on the gate insulating layer, and a second interlayer insulating layer on the first interlayer insulating layer.

In some embodiments, the first groove and the third groove penetrate the second interlayer insulating layer, and wherein the second groove penetrates the second interlayer insulating layer, the first interlayer insulating layer, and the gate insulating layer.

In some embodiments, the second groove further penetrates the buffer layer.

In some embodiments, the first groove and the third groove further penetrate at least a portion of the first interlayer insulating layer, and the second groove further penetrates at least a portion of the barrier layer.

In some embodiments, the display device further comprises: a first gate electrode on the gate insulating layer and overlapping the first pixel area; a second gate electrode on the gate insulating layer, overlapping the second pixel area, and connected to the first gate electrode; a third gate electrode on the gate insulating layer and overlapping the third pixel area; a fourth gate electrode on the gate insulating layer, overlapping the fourth pixel area, and connected to the third gate electrode; a fifth gate electrode on the first interlayer insulating layer and overlapping the first pixel area; a sixth gate electrode on the first interlayer insulating layer and overlapping the second pixel area; a seventh gate electrode on the first interlayer insulating layer and overlapping the third pixel area; and an eighth gate electrode on the first interlayer insulating layer and overlapping the fourth pixel area.

In some embodiments, the display device further comprises: a first conductive layer on the second interlayer insulating layer and overlapping the first pixel area; a second conductive layer on the second interlayer insulating layer and overlapping the second pixel area; a fifth conductive layer on the organic insulating layer, overlapping the main valley area, and connected to the second conductive layer through a first contact hole penetrating the organic insulating layer; a third conductive layer on the second interlayer insulating layer and overlapping the second pixel area; a third conductive layer on the second interlayer insulating layer, overlapping the third pixel area, and connected to the fifth conductive layer through a second contact hole penetrating the organic insulating layer; and a fourth conductive layer on the second interlayer insulating layer and overlapping the fourth pixel area.

In some embodiments, a width of the second groove is greater than a width of the first groove and a width of the third groove.

In some embodiments, the second groove is to surround at least a portion of the plurality of pixel areas.

In some embodiments, each of the inorganic insulating layer and the organic insulating layer is continuously formed over the plurality of pixel areas.

Other aspects, features, and characteristics that are not described above will be more clearly understood from the accompanying drawings, claims, and detailed description.

BRIEF DESCRIPTION OF THE DRAWINGS

Illustrative, non-limiting embodiments will be more clearly understood from the following detailed description in conjunction with the accompanying drawings.

FIG. 2 is a block diagram illustrating the display device of FIG. 1, according to some embodiments of the present disclosure.

DETAILED DESCRIPTION

Figure 1:
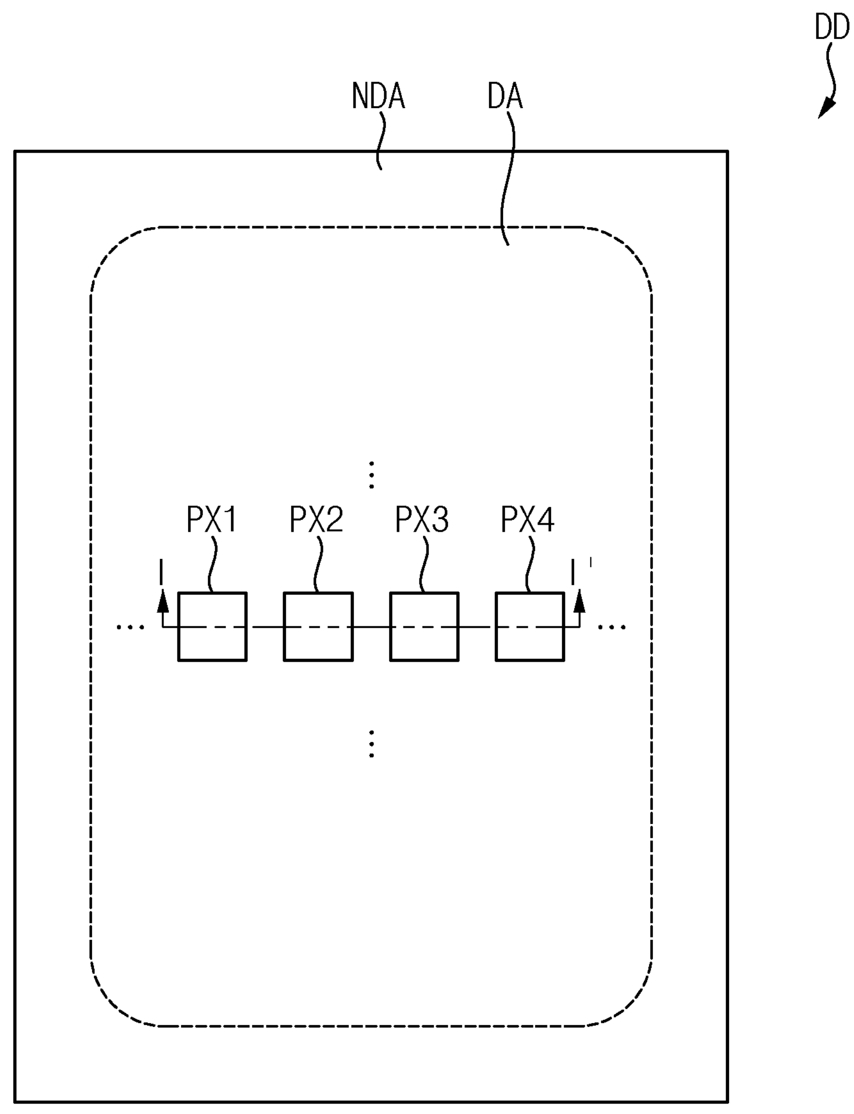
FIG. 1 is a plan view illustrating a display device according to some embodiments of the present disclosure.
Figure 1:
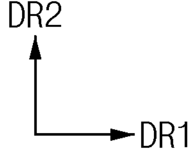

Hereinafter, display devices in accordance with embodiments will be described in more detail with reference to the accompanying drawings. The same reference numerals are used for the same components in the drawings, and redundant descriptions of the same components will be omitted.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a plan view illustrating a display device according to some embodiments of the present disclosure.

Referring to FIG. 1, a display device DD according to some embodiments may include a display area DA and a non-display area NDA. The display area DA may be defined as an area capable of generating light or displaying an image by adjusting a transmittance of light provided from an external light source. The non-display area NDA may be an area that does not display an image. In addition, the non-display area NDA may surround at least a portion of the display area DA.

A plurality of pixel areas may be disposed in the display area DA. For example, a first pixel area PX1, a second pixel area PX2, a third pixel area PX3, and a fourth pixel area PX4 may be disposed in the display area DA. Each of the plurality of pixel areas may emit light. For example, the first pixel area PX1 may emit light.

The plurality of pixel areas may be repeatedly arranged along a first direction DR1 and a second direction DR2 crossing (e.g., orthogonal to) the first direction DR1. For example, the second pixel area PX2 may be spaced apart (e.g., separated or offset) from the first pixel area PX1 in the first direction DR1. In addition, the third pixel area PX3 may be spaced apart from the second pixel area PX2 in the first direction DR1. In addition, the fourth pixel area PX4 may be spaced apart from the third pixel area PX3 in the first direction DR1.

FIG. 2 is a block diagram illustrating the display device of FIG. 1, according to some embodiments of the present disclosure.

Referring to FIGS. 1 and 2, the non-display area NDA may include a driving unit (e.g., a driver or driving circuit). The driving unit may include a driving controller 200, a gate driver 300, a gamma reference voltage generator 400, a data driver 500, and an emission driver 600.

The display area DA may include first, second, third, and fourth scan lines GIL, GWL, GCL, and GBL, first, second, third, and fourth data lines DL1, DL2, DL3, and DL4, and a plurality of emission lines EML. In addition, the display area DA may include a first pixel area PX1, a second pixel area PX2, a third pixel area PX3, and a fourth pixel area PX4.

The first pixel area PX1 may be electrically connected to the first, second, third, and fourth scan lines GIL, GWL, GCL, and GBL, the first data line DL1, and the emission line EML. The second pixel area PX2 may be electrically connected to the first, second, third, and fourth scan lines GIL, GWL, GCL, and GBL, the second data line DL2, and the emission line EML. The third pixel area PX3 may be electrically connected to the first, second, third, and fourth scan lines GIL, GWL, GCL, and GBL, the third data line DL3, and the emission line EML. The fourth pixel area PX4 may be electrically connected to the first, second, third, and fourth scan lines GIL, GWL, GCL, and GBL, the fourth data line DL4, and the emission line EML.

The first, second, third, and fourth scan lines GIL, GWL, GCL, and GBL and a plurality of emission lines EML may extend in the first direction DR1. In addition, the first, second, third, and fourth data lines DL1, DL2, DL3, and DL4 may extend in the second direction DR2.

A driving controller 200 may receive an input image data IMG and an input control signal CONT from an external device. In some embodiments, the input image data IMG may include red image data, green image data, and blue image data. In other embodiments, the input image data IMG may include white image data. In yet other embodiments, the input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, a fourth control signal CONT4, and a data signal DATA based on the input image data IMG and the input control signal CONT.

The driving controller 200 may generate a first control signal CONT1 for controlling the operation of a gate driver 300 based on the input control signal CONT and may output the first control signal CONT1 to the gate driver 300. The first control signal CONT1 may include a vertical start signal and a gate clock signal.

The driving controller 200 may generate a second control signal CONT2 for controlling the operation of a data driver 500 based on the input control signal CONT and may output the second control signal CONT2 to the data driver 500. The second control signal CONT2 may include a horizontal start signal and a load signal.

The driving controller 200 may generate a third control signal CONT3 for controlling the operation of a gamma reference voltage generator 400 based on the input control signal CONT and output the third control signal CONT3 to the gamma reference voltage generator 400.

The driving controller 200 may generate a fourth control signal CONT4 for controlling the operation of a emission driver 600 based on the input control signal CONT and may output the fourth control signal CONT4 to the emission driver 600.

The driving controller 200 may generate a data signal DATA based on the input image data IMG. The driving controller 200 may output the data signal DATA to the data driver 500.

The gate driver 300 may generate gate signals to drive the first, second, third, and fourth scan lines GWL, GIL, GCL, and GBL in response to the first control signal CONT1 received from the driving controller 200. The gate driver 300 may output the gate signals to the first, second, third, and fourth scan lines GWL, GIL, GCL, and GBL.

Figure 3:
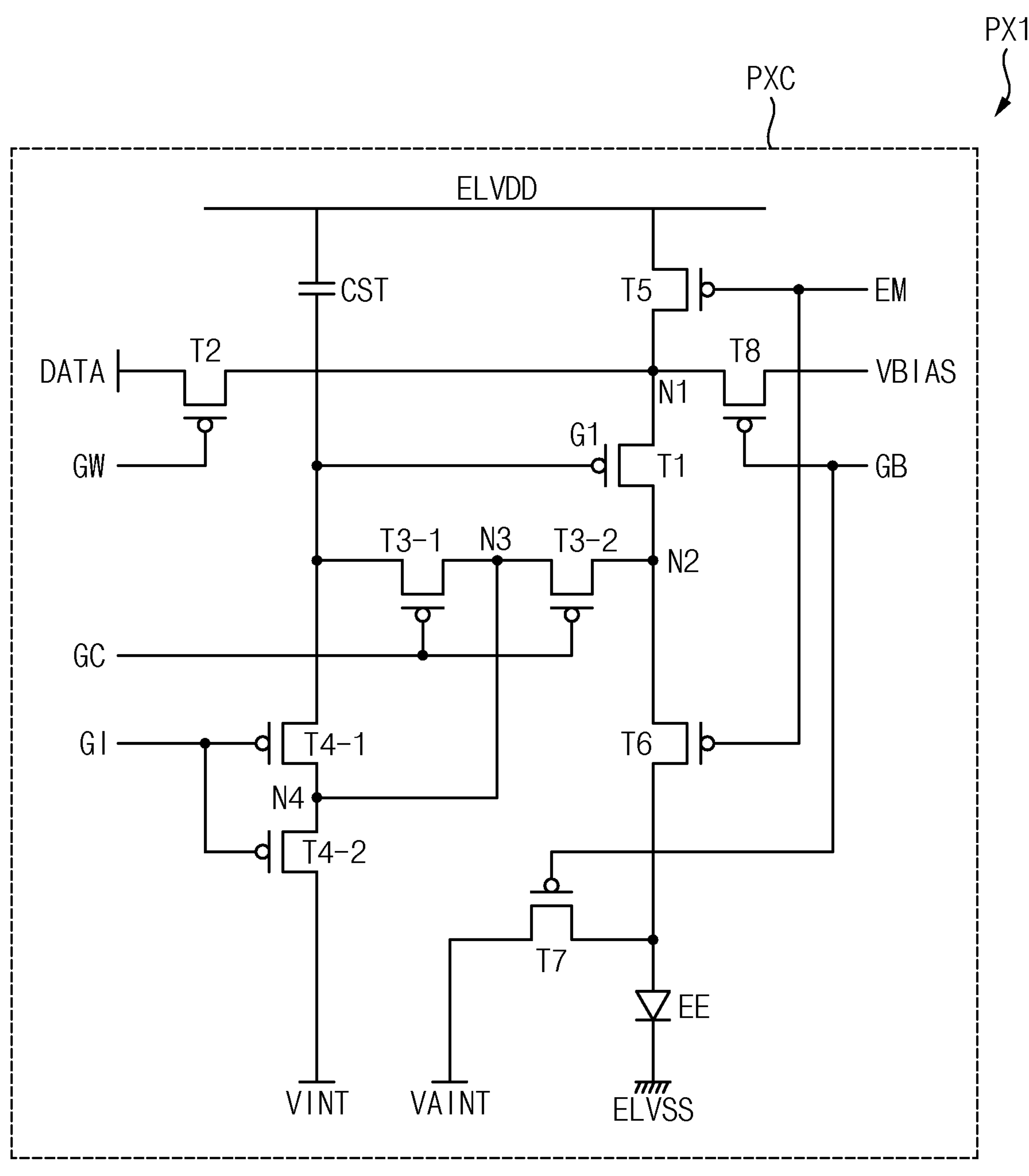
FIG. 3 is a circuit diagram illustrating a pixel included in the display device of FIG. 1, according to some embodiments of the present disclosure.

The gate signals may include a data initialization gate signal (e.g., a data initialization gate signal GI of FIG. 3), a compensation gate signal (e.g., a compensation gate signal GC of FIG. 3), a data write gate signal (e.g., a data write gate signal GW of FIG. 3), and a bias gate signal (e.g., a bias gate signal GB of FIG. 3).

The gamma reference voltage generator 400 may generate a gamma reference voltage VGREF in response to a third control signal CONT3 input from the driving controller 200. The gamma reference voltage generator 400 may provide the gamma reference voltage VGREF to the data driver 500. The gamma reference voltage VGREF may have a value corresponding to the data signals DATA.

In some embodiments, the gamma reference voltage generator 400 may be spaced apart from the data driver 500 in the second direction DR2. In other embodiments, the gamma reference voltage generator 400 may be disposed in the driving controller 200. In other embodiments, the gamma reference voltage generator 400 may be disposed in (e.g., integrated with) the data driver 500.

The data driver 500 may receive the second control signal CONT2 and the data signal DATA from the driving controller 200. In addition, the data driver 500 may receive the gamma reference voltage VGREF from the gamma reference voltage generator 400. The data driver 500 may convert the data signal DATA into an analog type data voltage using the gamma reference voltage VGREF. The data driver 500 may output the data voltage to the first, second, third, and fourth data lines DL1, DL2, DL3, and DL4.

The emission driver 600 may generate emission signals for driving emission lines EML in response to the fourth control signal CONT4 received from the driving controller 200. The emission driver 600 may output the emission signals to the emission lines EML.

In FIG. 2, for convenience of explanation, it is shown that the gate driver 300 is disposed on the first side of the display area DA and the emission driver 600 is disposed on the second side of the display area DA, but the present disclosure is not limited thereto. For example, both the gate driver 300 and the emission driver 600 may be disposed on the first side of the display area DA. For example, the gate driver 300 and the emission driver 600 may be integrally formed.

FIG. 3 is a circuit diagram illustrating a pixel included in the display device of FIG. 1, according to some embodiments of the present disclosure.

Referring to FIGS. 2 and 3, the first pixel area PX1 may include a pixel circuit PXC. The pixel circuit may include a light emitting element EE, a driving element T1, a data application switching element T2, a compensation switching element T3, a data initialization switching element T4, a first emission switching element T5, a second emission switching element T6, a light emitting element initialization switching element T7, and a storage capacitor CST.

A driving element T1 may apply a driving current to a light emitting element EE. A bias switching element T8 may be connected to a first electrode N1 of the driving element T1. The bias switching element T8 may apply a bias voltage VBIAS to the first electrode N1 of the driving element T1.

A data application switching element T2 may include a gate electrode to which the data write gate signal GW is applied, a first electrode to which the data voltage DATA is applied, and a second electrode connected to the first electrode N1 of the driving element T1. The data application switching element T2 may apply the data voltage DATA to the first electrode N1 of the driving element T1.

A compensation switching element T3 may be connected to the gate electrode G1 of the driving element T1. In addition, the compensation switching element T3 may be connected to a second electrode N2 of the driving element T1. In some embodiments, the compensation switching element T3 may include a first compensation switching element T3-1 and a second compensation switching element T3-2 electrically connected in series (i.e., they are configured to conduct the same signal).

The first compensation switching element T3-1 may include a gate electrode to which the compensation gate signal GC is applied, a first electrode connected to the gate electrode G1 of the driving element T1, and a second electrode connected to a first intermediate node N3.

The second compensation switching element T3-2 may include a gate electrode to which the compensation gate signal GC is applied, a first electrode connected to the first intermediate node N3, and a second electrode connected to the second electrode N2 of the driving element T1.

When the compensation switching element T3 includes two transistors T3-1 and T3-2 electrically connected in series, it is possible to prevent or substantially reduce a drop in a level of the data voltage DATA applied to the gate electrode G1 of the driving element T1 and stored in the storage capacitor CST by a current leakage.

A data initialization switching element T4 may be connected to the gate electrode G1 of the driving element T1. The data initialization switching element T4 may apply an initialization voltage VINT to the gate electrode G1 of the driving element T1. In some embodiments, the data initialization switching element T4 may include a first data initialization switching element T4-1 and a second data initialization switching element T4-2 electrically connected in series.

The first data initialization switching element T4-1 may include a gate electrode to which the data initialization gate signal GI is applied, a first electrode connected to a second intermediate node N4, and a second electrode connected to the gate electrode G1 of the driving element T1.

The second data initialization switching element T4-2 may include a gate electrode to which the data initialization gate signal GI is applied, a first electrode to which the initialization voltage VINT is applied, and a second electrode connected to the second intermediate node N4.

When the data initialization switching element T4 is composed of two transistors T4-1 and T4-2 electrically connected in series, it is possible to prevent or substantially reduce a drop in the level of the data voltage DATA applied to the gate electrode G1 of the driving element T1 and stored in the storage capacitor CST by a current leakage.

A first emission switching element T5 may include a first electrode to which a first power voltage ELVDD is applied, a gate electrode to which an emission signal EM is applied, and a second electrode connected to the first electrode N1 of the driving element T1.

A second emission switching element T6 may include a first electrode connected to the second electrode N2 of the driving element T1, a gate electrode to which the emission signal EM is applied, and a second electrode connected to a first electrode of the light emitting element EE.

A light emitting element initialization switching element T7 may include a first electrode to which a light emitting element initialization voltage VAINT is applied, a gate electrode to which the bias gate signal GB is applied, and a second electrode connected to the first electrode of the light emitting element EE.

A bias switching element T8 may include a first electrode to which a bias voltage VBIAS is applied, a gate electrode to which the bias gate signal GB is applied, and a second electrode connected to the first electrode N1 of the driving element T1.

A second power voltage ELVSS may be applied to a second electrode of the light emitting element EE. For example, the first power voltage ELVDD may be a high power voltage, and the second power voltage ELVSS may be a low power voltage.

A storage capacitor CST may include a first electrode to which the first power voltage ELVDD is applied and a second electrode connected to the gate electrode G1 of the driving element T1. The storage capacitor CST may maintain the level of the data voltage DATA applied to the gate electrode G1 of the driving element T1.

FIG. 3 may illustrate an example in which the pixel circuit PXC includes a light emitting element EE, a driving element T1, a data application switching element T2, a compensation switching element T3, a data initialization switching element T4, a first emission switching element T5, a second emission switching element T6, a light emitting element initialization switching element T7, and a storage capacitor CST.

However, the present disclosure is not limited thereto. That is, in some embodiments, one or more of the components of the pixel circuit PXC may be omitted. In addition, other configurations may be added in some examples. For example, the pixel circuit PXC may further include a second storage capacitor including a first electrode to which the first power voltage ELVDD is applied and a second electrode connected to the first electrode N1 of the driving element T1.

In addition, FIG. 3 may illustrate the pixel circuit PXC included in the first pixel area PX1, but the present disclosure is not limited thereto. That is, one or more of the second pixel area PX2, the third pixel area PX3, and the fourth pixel area PX4 may also include the pixel circuit PXC of FIG. 3.

Figure 4:
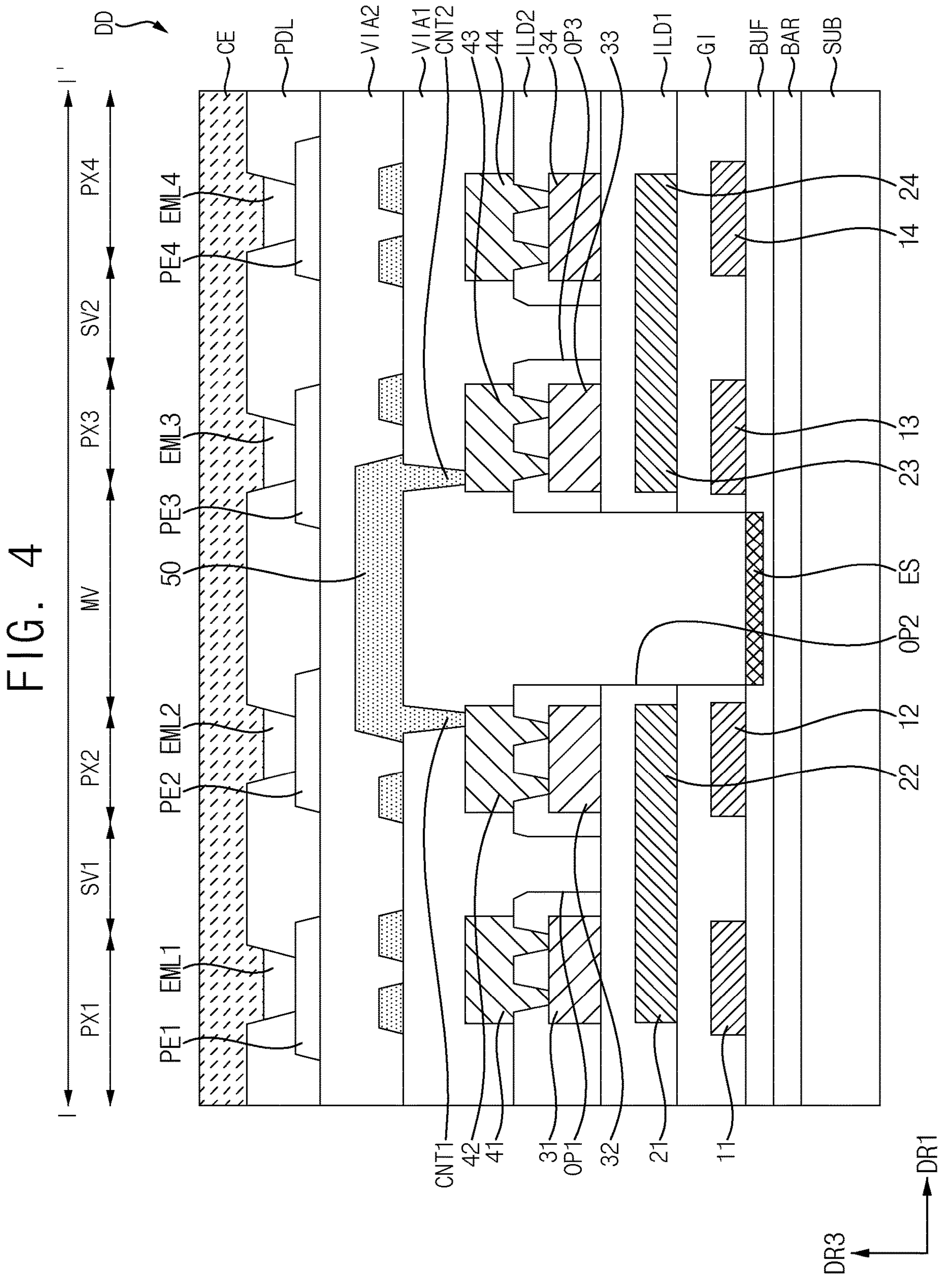
FIGS. 4 and 5 are cross-sectional views of the display device of FIG. 1 taken along the line I-I', according to some embodiments of the present disclosure.
Figure 5:
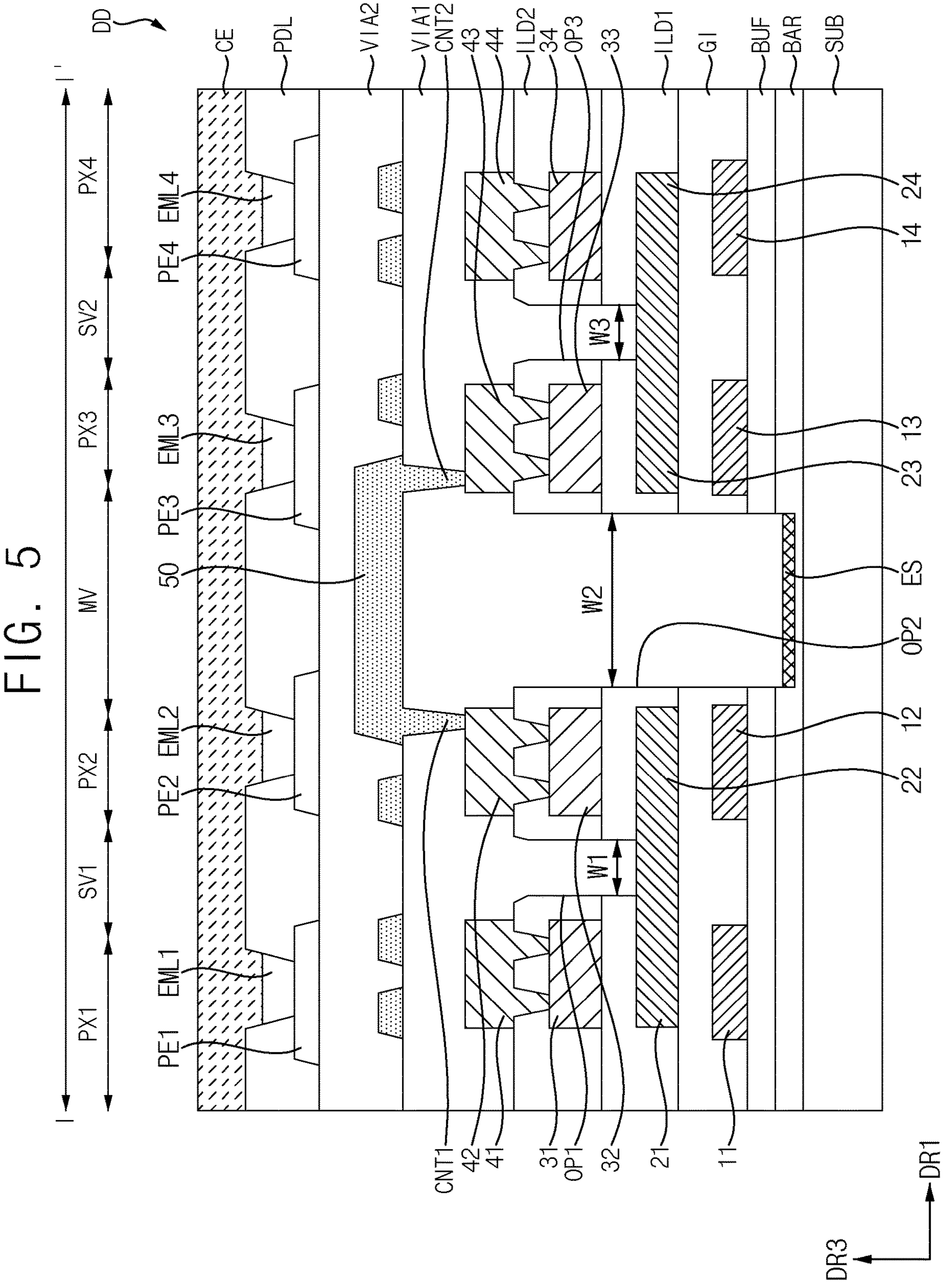

FIGS. 4 and 5 are cross-sectional views of the display device of FIG. 1 taken along the line I-I', according to some embodiments of the present disclosure.

Referring to FIGS. 4 and 5, the display device DD may include a first pixel area PX1, a second pixel area PX2, a third pixel area PX3, a fourth pixel area PX4, a first sub valley area SV1, a second sub valley area SV2, and a main valley area MV.

A first sub valley area SV1 may be disposed between the first pixel area PX1 and the second pixel area PX2. A second sub valley area SV2 may be disposed between the third pixel area PX3 and the fourth pixel area PX4. A main valley area MV may be disposed between the second pixel area PX2 and the third pixel area PX3.

In addition, the display device DD may include a substrate SUB, a barrier layer BAR, a buffer layer BUF, a gate insulating layer GI, a first interlayer insulating layer ILD1, a second interlayer insulating layer ILD2, a first organic insulating layer VIA1, and a second organic insulating layer VIA2, a first active pattern 11, a second active pattern 12, a third active pattern 13, a fourth active pattern 14, a first gate electrode 21, a second gate electrode 22, a third gate electrode 23, a fourth gate electrode 24, a fifth gate electrode 31, a sixth gate electrode 32, a seventh gate electrode 33, an eighth gate electrode 34, a first conductive layer 41, a second conductive layer 42, a fifth conductive layer 50, a third conductive layer 43, a fourth conductive layer 44, a first contact hole CNT1, a second contact hole CNT2, a first pixel electrode PE1, a second pixel electrode PE2, a third pixel electrode PE3, a fourth pixel electrode PE4, a first light emitting layer EML1, a second light emitting layer EML2, a third light emitting layer EML3, a fourth light emitting layer EML4, and a common electrode CE.

A substrate SUB may include a transparent material or an opaque material. The substrate SUB may be formed of a transparent resin substrate. The transparent resin substrate may include a polyimide substrate. In this case, the polyimide substrate may include a first organic layer, a first barrier layer, a second organic layer, and/or the like.

In some examples, the substrate SUB may include a quartz substrate, a synthetic quartz substrate, a calcium fluoride substrate, a fluorine-doped quartz substrate, a sodalime substrate, a non-alkali glass substrate, and the like. These materials may be used alone or in combination with each other.

A barrier layer BAR may be disposed on the substrate SUB. The barrier layer BAR may prevent impurities from penetrating into an upper portion of the substrate SUB from the outside or substantially reduce penetration thereof. The barrier layer BAR may include an inorganic material such as silicon oxide, silicon nitride, silicon oxynitride, or the like. These materials may be used alone or in combination with each other. The barrier layer BAR may be formed in a single layer structure or a multi-layer structure. The barrier layer BAR may be continuously disposed over the first pixel area PX1, the second pixel area PX2, the third pixel area PX3, and the fourth pixel area PX4.

A buffer layer BUF may be disposed on the barrier layer BAR. The buffer layer BUF may prevent metal atoms or impurities from diffusing from the substrate SUB to first, second, third, and fourth active patterns 11, 12, 13, and 14.

For example, the buffer layer BUF may include an inorganic material such as silicon oxide, silicon nitride, silicon oxynitride, and the like. These materials may be used alone or in combination with each other. The buffer layer BUF may be continuously disposed over the first pixel area PX1, the second pixel area PX2, the third pixel area PX3, and the fourth pixel area PX4.

First, second, third, and fourth active patterns 11, 12, 13, and 14 may be disposed on the buffer layer BUF. The first, second, third, and fourth active patterns 11, 12, 13, and 14 may overlap (e.g., in a plan view) the first, second, third, and fourth pixel areas PX1, PX2, PX3, and PX4, respectively.

Each of the first, second, third, and fourth active patterns 11, 12, 13, and 14 may include a metal oxide semiconductor, an inorganic semiconductor (e.g., amorphous silicon, polysilicon, etc.), and/or an organic semiconductor.

Each of the first, second, third, and fourth active patterns 11, 12, 13, and 14 may include a source area, a drain area, and a channel area disposed between the source area and the drain area. The first, second, third, and fourth active patterns 11, 12, 13, and 14 are formed through the same or substantially same process and may include the same or substantially same material.

The metal oxide semiconductor may include a binary compound ("$AB_x$"), a ternary compound ("$AB_xC_y$"), a tetragonal compound ("$AB_xC_yD_z$"), and/or the like, which may include indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), and indium gallium zinc oxide ("IGZO"). These materials may be used alone or in combination with each other.

A gate insulating layer GI may be disposed on the buffer layer BUF. The gate insulating layer GI may sufficiently cover (e.g., completely cover) the first, second, third, and fourth active patterns 11, 12, 13, and 14, and may have a substantially flat upper surface without generating a step around the first, second, third, and fourth active patterns 11, 12, 13, and 14.

For example, the gate insulating layer GI may include inorganic materials such as silicon oxide ("$SiO_x$"), silicon nitride ("$SiN_x$"), silicon carbide ("$SiC_x$"), silicon oxynitride ("$SiO_x N_y$"), silicon oxycarbide ("$SiO_xC_y$"), and the like. These materials may be used alone or in combination with each other. The gate insulating layer GI may be continuously disposed over the first pixel area PX1, the second pixel area PX2, the third pixel area PX3, and the fourth pixel area PX4.

A first gate electrode 21 and a second gate electrode 22 may be disposed on the gate insulating layer GI. The first gate electrode 21 and the second gate electrode 22 may overlap (e.g., in a plan view) the first pixel area PX1 and the second pixel area PX2, respectively.

The first gate electrode 21 may overlap the channel area of the first active pattern 11. In addition, the second gate electrode 22 may overlap the channel area of the second active pattern 12. In some embodiments, the first gate electrode 21 and the second gate electrode 22 may be connected to each other. In some examples, the first gate electrode 21 and the second gate electrode 22 may be integrally formed (e.g., as a single monolithic unit).

A third gate electrode 23 and a fourth gate electrode 24 may be disposed on the gate insulating layer GI. The third gate electrode 23 and the fourth gate electrode 24 may overlap the third pixel area PX3 and the fourth pixel area PX4, respectively.

A third gate electrode 23 may overlap the channel area of the third active pattern 13. In addition, the fourth gate electrode 24 may overlap the channel area of the fourth active pattern 14. In some embodiments, the third gate electrode 23 and the fourth gate electrode 24 may be connected to each other. In some examples, the third gate electrode 23 and the fourth gate electrode 24 may be integrally formed (e.g., as a single monolithic unit).

Each of the first, second, third, and fourth gate electrodes 21, 22, 23, and 24 may include a metal, an alloy metal nitride, a conductive metal oxide, a transparent conductive material, or the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like.

Examples of the conductive metal oxide may include Indium tin oxide, indium zinc oxide, or the like. In addition, examples of the metal nitride may include aluminum nitride ("$AlN_x$"), tungsten nitride ("$WN_x$"), chromium nitride ("$CrN_x$"), or the like. Each of these materials may be used alone or in combination with each other.

The first, second, third, and fourth gate electrodes 21, 22, 23, and 24 may be formed through the same or substantially same process and may include the same or substantially same material.

A first interlayer insulating layer ILD1 may be disposed on the gate insulating layer GI. The first interlayer insulating layer ILD1 may sufficiently cover (e.g., completely cover) the first, second, third, and fourth gate electrodes 21, 22, 23, and 24, and may have a substantially flat upper surface without generating a step around the first, second, third, and fourth gate electrodes 21, 22, 23, and 24.

For example, the first interlayer insulating layer ILD1 may include an inorganic material such as silicon oxide, silicon nitride, silicon carbide, silicon oxynitride, silicon oxycarbide, and the like. These materials may be used alone or in combination with each other. The first interlayer insulating layer ILD1 may be continuously disposed over the first pixel area PX1, the second pixel area PX2, the third pixel area PX3, and the fourth pixel area PX4.

Fifth, sixth, seventh, and eighth gate electrodes 31, 32, 33, and 34 may be disposed on the first interlayer insulating layer ILD1. The fifth, sixth, seventh, and eighth gate electrodes 31, 32, 33, and 34 may overlap (e.g., in a plan view) the first, second, third, and fourth pixel areas PX1, PX2, PX3, and PX4, respectively.

The fifth gate electrode 31 together with the first gate electrode 21 may constitute the first storage capacitor (e.g., the storage capacitor CST of FIG. 3). The sixth gate electrode 32 together with the second gate electrode 22 may constitute a second storage capacitor. The seventh gate electrode 33 together with the third gate electrode 23 may constitute a third storage capacitor. The eighth gate electrode 34 together with the fourth gate electrode 24 may constitute a fourth storage capacitor.

For example, each of the fifth, sixth, seventh, and eighth gate electrodes 31, 32, 33, and 34 may include a metal, an alloy metal nitride, a conductive metal oxide, a transparent conductive material, and/or the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. Examples of the conductive metal oxide may include Indium tin oxide, indium zinc oxide, or the like. In addition, examples of the metal nitride may include aluminum nitride ("$AlN_x$"), tungsten nitride ("$WN_x$"), chromium nitride ("$CrN_x$"), or the like. Each of these materials may be used alone or in combination with each other.

The fifth, sixth, seventh, and eighth gate electrodes 31, 32, 33, and 34 may be formed through the same or substantially same process and may include the same or substantially same material.

A second interlayer insulating layer ILD2 may be disposed on the first interlayer insulating layer ILD1. The second interlayer insulating layer ILD2 may sufficiently cover the fifth, sixth, seventh, and eighth gate electrodes 31, 32, 33, and 34 and may have a substantially flat upper surface without generating a step around the fifth, sixth, seventh, and eighth gate electrodes 31, 32, 33, and 34.

For example, the second interlayer insulating layer ILD2 may include an inorganic material such as silicon oxide, silicon nitride, silicon carbide, silicon oxynitride, silicon oxycarbide, and the like. These materials may be used alone or in combination with each other. The second interlayer insulating layer ILD2 may be continuously disposed over the first pixel area PX1, the second pixel area PX2, the third pixel area PX3, and the fourth pixel area PX4.

The barrier layer BAR, the buffer layer BUF, the gate insulating layer GI, the first interlayer insulating layer ILD1, and the second interlayer insulating layer ILD2 may form an inorganic insulating layer.

First, second, third, and fourth conductive layers 41, 42, 43, and 44 may be disposed on the second interlayer insulating layer ILD2. The first, second, third, and fourth conductive layers 41, 42, 43, and 44 may overlap (e.g., in a plan view) the first, second, third, and fourth pixel areas PX1, PX2, PX3, and PX4, respectively.

The first, second, third, and fourth conductive layers 41, 42, 43, and 44 may be connected to the fifth, sixth, seventh, and eighth gate electrodes 31, 32, 33, and 34, respectively, through corresponding contact holes. Each of the first, second, third, and fourth conductive layers 41, 42, 43, and 44 may refer to a portion of one of the first, second, third, and fourth scan lines (e.g., first, second, third, and fourth scan lines GIL, GWL, GCL, and GBL of FIG. 2).

For example, each of the first, second, third, and fourth conductive layers 41, 42, 43, and 44 may include a metal, an alloy, a conductive metal oxide, a transparent conductive material, and the like. These materials may be used alone or in combination with each other. The first, second, third, and fourth conductive layers 41, 42, 43, and 44 may be formed through the same or substantially same process and may include the same or substantially same material.

A first organic insulating layer VIA1 may be disposed on the second interlayer insulating layer ILD2. The first organic insulating layer VIA1 may sufficiently cover the first, second, third, and fourth conductive layers 41, 42, 43, and 44.

The first organic insulating layer VIA1 may include an organic material. For example, the first organic insulating layer VIA1 may include organic materials such as phenolic resin, acrylic resin, polyimide resin, polyamide resin, siloxane resin, and epoxy resin. These materials may be used alone or in combination with each other. The first organic insulating layer VIA1 may be continuously disposed over the first pixel area PX1, the second pixel area PX2, the third pixel area PX3, and the fourth pixel area PX4.

A fifth conductive layer 50 may be disposed on the first organic insulating layer VIA1. The fifth conductive layer 50 may overlap (e.g., in a plan view) the main valley area VA. The fifth conductive layer 50 may be connected to the second conductive layer 42 through a first contact hole CNT1. In addition, the fifth conductive layer 50 may be connected to the third conductive layer 43 through a second contact hole CNT2.

A second organic insulating layer VIA2 may be disposed on the first organic insulating layer VIA1. The second organic insulating layer VIA2 may sufficiently cover (e.g., completely cover) the fifth conductive layer 50.

The second organic insulating layer VIA2 may include an organic material. For example, the second organic insulating layer VIA2 may include organic materials such as phenolic resin, acrylic resin, polyimide resin, polyamide resin, siloxane resin, and epoxy resin, and the like. These materials may be used alone or in combination with each other. The second organic insulating layer VIA2 may be continuously disposed over the first pixel area PX1, the second pixel area PX2, the third pixel area PX3, and the fourth pixel area PX4.

First, second, third, and fourth pixel electrodes PE1, PE2, PE3, and PE4 may be disposed on the second organic insulating layer VIA2. The first, second, third, and fourth pixel electrodes PE1, PE2, PE3, and PE4 may overlap the first, second, third, and fourth pixel areas PX1, PX2, PX3, and PX4, respectively.

For example, each of the first, second, third, and fourth pixel electrodes PE1, PE2, PE3, and PE4 may include a metal, an alloy, a metal nitride, a conductive metal oxide, a transparent conductive material, and the like. These materials may be used alone or in combination with each other. In some embodiments, each of the first, second, third, and fourth pixel electrodes PE1, PE2, PE3, and PE4 may have a stacked structure including ITO/Ag/ITO or the like.

The first, second, third, and fourth pixel electrodes PE1, PE2, PE3, and PE4 may be formed through the same or substantially same process and may include the same or substantially same material. For example, each of the first, second, third, and fourth pixel electrodes PE1, PE2, PE3, and PE4 may operate as an anode.

A pixel defining layer PDL may be disposed on the second organic insulating layer VIA2. In a cross-sectional view, the pixel defining layer PDL may cover both side portions of each of the first, second, third, and fourth pixel electrodes PE1, PE2, PE3, and PE4. In addition, an opening that exposes a portion of the upper surface of each of the first, second, third, and fourth pixel electrodes PE1, PE2, PE3, and PE4 may be defined in the pixel defining layer PDL. In other words, the pixel defining layer PDL may define a plurality of openings, each of which exposes a portion of the upper surface of a corresponding one of the first, second, third, and fourth pixel electrodes PE1, PE2, PE3, and PE4.

For example, the pixel defining layer PDL may include an inorganic material or an organic material. In some embodiments, the pixel defining layer PDL may include an organic material such as an epoxy resin, a siloxane resin, and/or the like. These materials may be used alone or in combination with each other. In other embodiments, the pixel defining layer PDL may further include a light blocking material including a black pigment, a black dye, and the like.

First, second, third, and fourth light emitting layers EML1, EML2, EML3, and EML4 may be disposed on the first, second, third, and fourth pixel electrodes PE1, PE2, PE3, and PE4, respectively. Each of the first, second, third, and fourth light emitting layers EML1, EML2, EML3, and EML4 may include an organic material that emits light of a set or predetermined color. For example, the first light emitting layer EML1 may include an organic material that emits red light, and the second light emitting layer EML2 may include an organic material that emits green light.

A common electrode CE may be disposed on the first, second, third, and fourth light emitting layers EML1, EML2, EML3, and EML4 and the pixel defining layer PDL. The common electrode CE may include a metal, an alloy, a metal nitride, a conductive metal oxide, a transparent conductive material, or the like. These materials may be used alone or in combination with each other. For example, the common electrode CE may operate as a cathode.

The second interlayer insulating layer ILD2 may define a first groove OP1 at a portion overlapping (e.g., in a plan view) the first sub valley area SV1. That is, the first groove OP1 may penetrate a portion of the second interlayer insulating layer ILD2 overlapping the first sub valley area SV1. However, the present disclosure is not limited thereto. That is, as shown in FIG. 5, the first groove OP1 may penetrate at least a portion of the first interlayer insulating layer ILD1 as well as the second interlayer insulating layer ILD2. The first organic insulating layer VIA1 may fill the first groove OP1.

The second interlayer insulating layer ILD2 may define a third groove OP3 at a portion overlapping the second sub valley area SV2. That is, the third groove OP3 may penetrate a portion of the second interlayer insulating layer ILD2 overlapping the second sub valley area SV2. However, the present disclosure is not limited thereto. That is, as shown in FIG. 5, the third groove OP3 may penetrate at least a portion of the first interlayer insulating layer ILD1 as well as the second interlayer insulating layer ILD2. The first organic insulating layer VIA1 may fill the third groove OP3.

The first groove OP1 and the third groove OP3 may be defined in the portions of the first interlayer insulating layer ILD1 and the second interlayer insulating layer ILD2 overlapping the first sub valley area SV1 and the second sub valley area SV2, respectively, so that stress applied to the first interlayer insulating layer ILD1 and second interlayer insulating layer ILD2 may be prevented from spreading to the pixel circuit, or the spread of such stress may be substantially reduced.

In addition, when the first groove OP1 penetrates the first interlayer insulating layer ILD1, the first groove OP1 may only penetrate to (and thus expose) the upper portions of the first gate electrode 21 and the second gate electrode 22. Accordingly, the first pixel area PX1 and the second pixel area PX2 may be connected to each other by connecting the first gate electrode 21 and the second gate electrode 22.

That is, the first pixel area PX1 and the second pixel area PX2 may not need to be connected through separate contact holes. As in the illustrated embodiment of FIG. 5, when the first pixel area PX1 and the second pixel area PX2 are directly connected through the first gate electrode 21 and the second gate electrode 22, the resolution of the display device DD may be improved as compared to when the first pixel area PX1 and the second pixel area PX2 are connected to each other through the contact hole.

FIGS. 4 and 5 may show an example in which the first gate electrode 21 and the second gate electrode 22 are connected to each other (e.g., are integrally formed), but the present disclosure is not limited thereto. That is, the fifth gate electrode 31 and the sixth gate electrode 32 may be connected to each other (e.g., may be integrally formed). In this case, the first groove OP1 may penetrate to (and thus expose) only the upper portions of the fifth gate electrode 31 and the sixth gate electrode 32.

In addition, when the third groove OP3 penetrates the first interlayer insulating layer ILD1, the third groove OP3 may only penetrate to (and thus expose) the upper portions of the third gate electrode 23 and the fourth gate electrode 24. Accordingly, the third pixel area PX3 and the fourth pixel area PX4 may be connected to each other by connecting the third gate electrode 23 and the fourth gate electrode 24. That is, the third pixel area PX3 and the fourth pixel area PX4 may not need to be connected through separate contact holes.

FIGS. 4 and 5 may show an example in which the third gate electrode 23 and the fourth gate electrode 24 are connected to each other (e.g., are integrally formed), but the present disclosure is not limited thereto. That is, the seventh gate electrode 33 and the eighth gate electrode 34 may be connected to each other (may be integrally formed). In this case, the third groove OP3 may penetrate to (and thus expose) only the upper portions of the seventh gate electrode 33 and the eighth gate electrode 34.

The second interlayer insulating layer ILD2, the first interlayer insulating layer ILD1, and the gate insulating layer GI may define a second groove OP2 in a portion overlapping (e.g., in a plan view) the main valley area MV. That is, the second groove OP2 may penetrate the second interlayer insulating layer ILD2, the first interlayer insulating layer ILD1, and the gate insulating layer GI.

However, the present disclosure is not limited thereto. That is, the second groove OP2 may penetrate the second interlayer insulating layer ILD2, the first interlayer insulating layer ILD1, the gate insulating layer GI, and at least a portion of the buffer layer BUF. In some embodiments, as shown in FIG. 5, the second groove OP2 may penetrate the second interlayer insulating layer ILD2, the first interlayer insulating layer ILD1, the gate insulating layer GI, the buffer layer BUF, and at least a portion of the barrier layer BAR.

The first organic insulating layer VIA1 may fill the first groove OP1, the second groove OP2, and the third groove OP3. The first organic insulating layer VIA1 may absorb stress applied to the display device DD. Accordingly, the display device may be robust and flexible against external impacts.

The fifth conductive layer 50 may be connected to the second conductive layer 42 through a first contact hole CNT1. In addition, the fifth conductive layer 50 may be connected to the third conductive layer 43 through a second contact hole CNT2. Accordingly, the second pixel area PX2 and the third pixel area PX3 may be connected to each other.

A width W1 of the first groove OP1 may be the same as a width W3 of the third groove OP3. In some embodiments, a width W2 of the second groove OP2 may be greater than the width W1 of the first groove OP1 and the width W3 of the third groove OP3.

In some embodiments, an etching prevention layer ES may be disposed on the bottom surface of the second groove OP2. The etching prevention layer ES may refer to an inorganic insulating layer, for example, a layer including a material having an etching rate different from an etching rate of the barrier layer BAR, the buffer layer BUF, the gate insulating layer GI, the first interlayer insulating layer ILD1, and the second interlayer insulating layer ILD2, or etched by different etching conditions. In some embodiments, the etching prevention layer ES may include a semiconductor material or a metal material. In some embodiments, the etching prevention layer ES may be disposed on the bottom surface and the side surface of the second groove OP2.

In some embodiments, the etching prevention layer ES may include a semiconductor material or a metal material. In some embodiments, the etching prevention layer ES may be disposed on the each of bottom surface and the side surface of the second groove OP2.

FIGS. 6, 7, 8, and 9 are plan views illustrating a portion of the display device of FIG. 1, according to some embodiments of the present disclosure.

Figure 6:
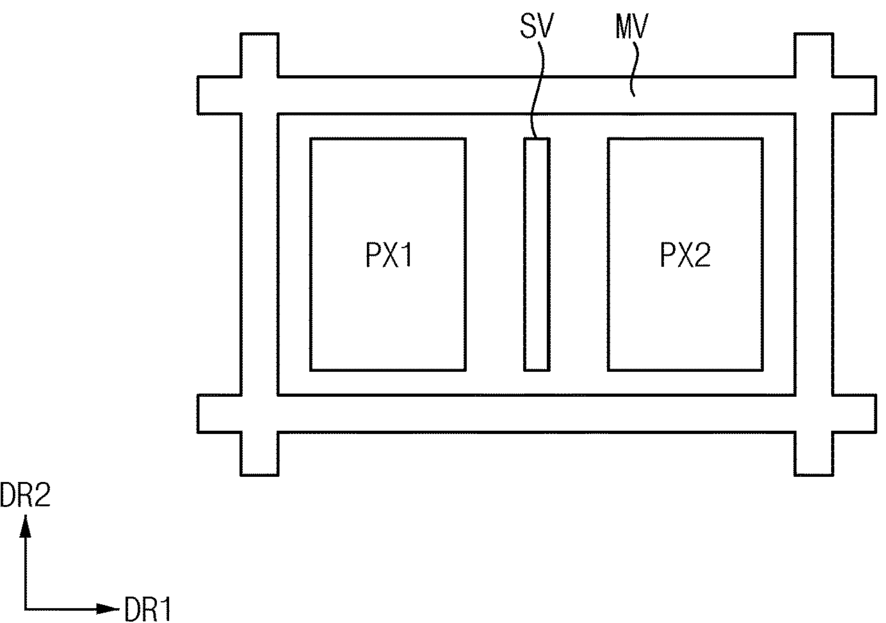
FIGS. 6, 7, 8, and 9 are plan views illustrating a portion of the display device of FIG. 1, according to some embodiments of the present disclosure.

Referring to FIGS. 6, 7, 8, and 9, the main valley area MV may be disposed to group and surround a plurality of pixel areas. In the case of FIG. 6, the main valley area MV may be disposed to surround two pixel areas, that is, the first pixel area PX1 and the second pixel area PX2. On the other hand, In the case of FIG. 7, the main valley area MV may be disposed to surround six pixel areas, that is, first to sixth pixel areas PX1, PX2, PX3, PX4, PX5, and PX6. However, the present disclosure is not limited thereto, and the number of pixel areas to be grouped by the main valley area may be variously modified in a suitable manner.

In addition, the number of pixel areas to be grouped by the main valley area VA may be the same across one display device (e.g., the display device DD of FIG. 1). However, the present disclosure is not limited thereto. That is, the number of pixel areas to be grouped by the main valley area VA may be different depending on the location of the display device. For example, in the case of an area vulnerable to cracks or stress, the main valley area VA may be disposed surrounding two pixel areas. A main belly area VA may be disposed in the remaining area to surround three or more pixel areas.

Figure 7:
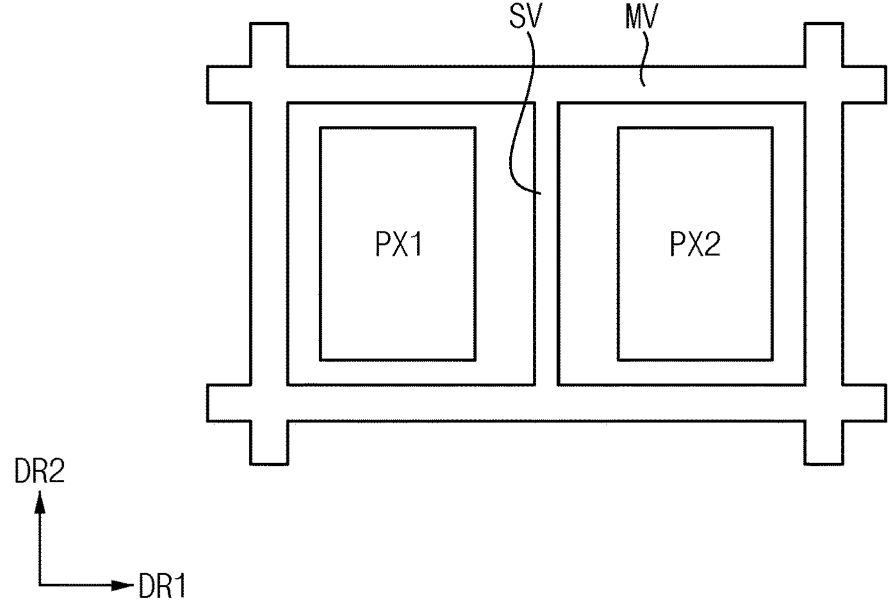

A sub valley area SV may be disposed between two adjacent pixel areas in which the main valley area VA does not exist among a plurality of pixel areas. For example, as shown in FIG. 6, the sub valley area SV may be disposed between the first pixel area PX1 and the second pixel area PX2. Also, as shown in FIG. 7, the sub valley area SV may be disposed between the first pixel area PX1 and the second pixel area PX2, between the second pixel area PX2 and the third pixel area PX3, between the fourth pixel area PX4 and the fifth pixel area PX5, between the fifth pixel area PX5 and the sixth pixel area PX6, between the first pixel area PX1 and the fourth pixel area PX4, between the second pixel area PX2 and the fifth pixel area PX5, and between the third pixel area PX3 and the sixth pixel area PX6.

Figure 8:
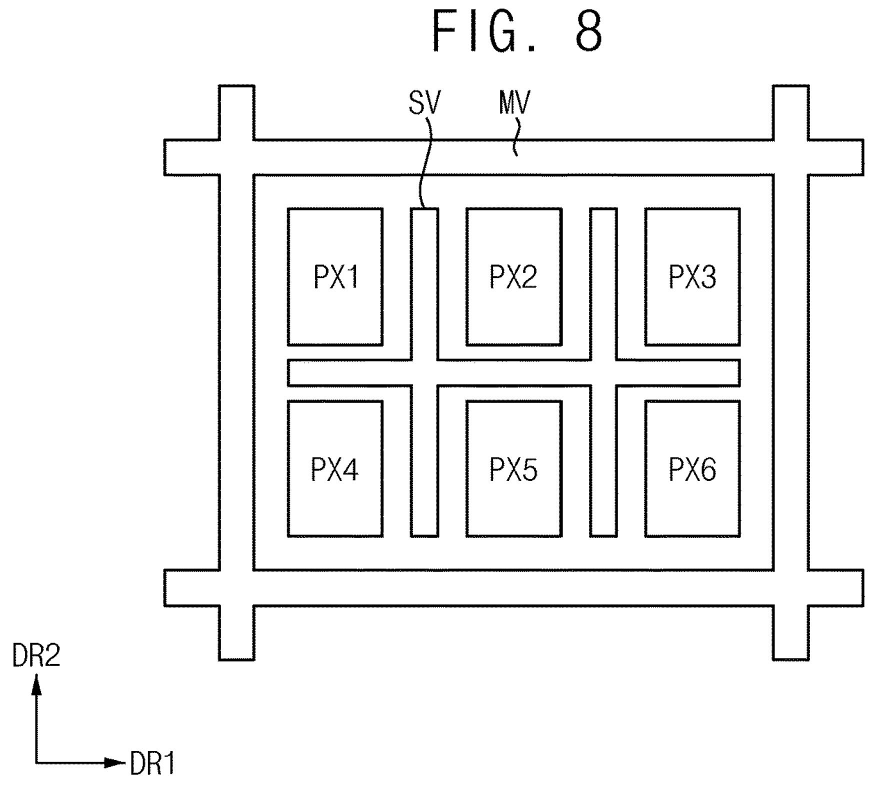
Figure 9:
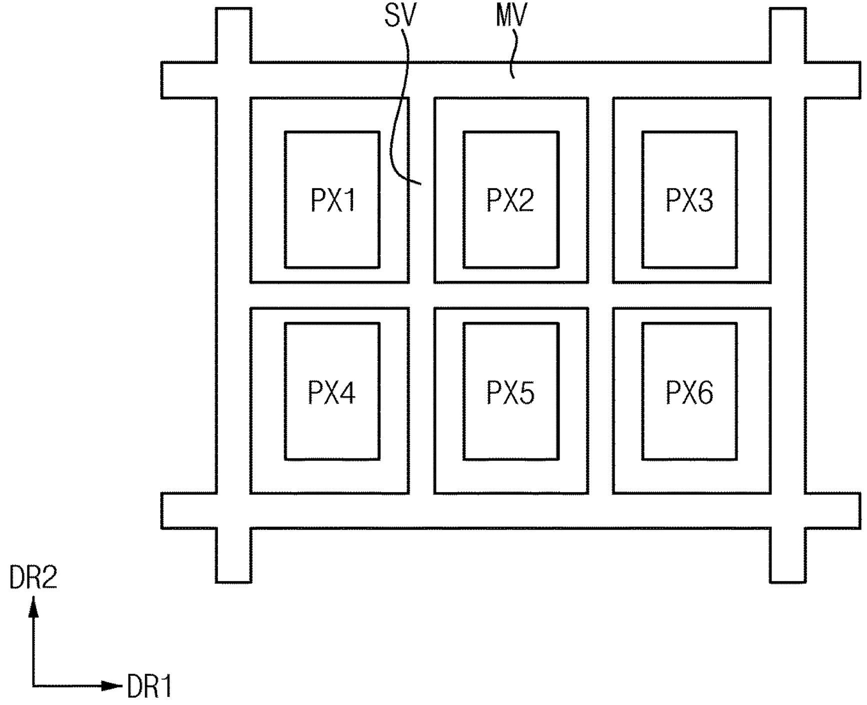

In some embodiments, as shown in FIGS. 6 and 8, the main valley area VA and the sub valley area SV may not be connected to each other. However, this disclosure is not limited thereto, and as shown in FIGS. 7 and 9, the main valley area VA and the sub valley area SV may be connected to each other.

The present disclosure can be applied to various display devices. For example, the present disclosure is applicable to various display devices such as display devices for vehicles, ships and aircraft, portable communication devices, display devices for exhibition or information transmission, medical display devices, and the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

When one or more embodiments may be implemented differently, a specific process order may be performed differently from the described order. For example, (i) the disclosed operations of a process are merely examples, and may involve various additional operations not explicitly covered, and (ii) the temporal order of the operations may be varied.

The display device and/or any other relevant devices or components, such as the driving controller, the gamma reference voltage generator, data driver, gate driver, and the emission driver, according to embodiments of the present invention described herein may be implemented utilizing any suitable hardware, firmware (e.g., an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a substrate having a plurality of pixel areas comprising a first pixel area, a second pixel area offset from the first pixel area, a third pixel area offset from the second pixel area, and a fourth pixel area offset from the third pixel area, and having a first sub valley area between the first pixel area and the second pixel area, a second sub valley area between the third pixel area and the fourth pixel area, and a main valley area between the second pixel area and the third pixel area;

an inorganic insulating layer on the substrate and defining a first groove, a third groove, and a second groove respectively overlapping the first sub valley area, the second sub valley area, and the main valley area, a depth of the second groove being different from a depth of the first groove; and an organic insulating layer on the inorganic insulating layer and filling the first groove, the second groove and the third groove.

2. The display device of claim 1, wherein the inorganic insulating layer comprises a barrier layer, a buffer layer on the barrier layer, a gate insulating layer on the buffer layer, a first interlayer insulating layer on the gate insulating layer, and a second interlayer insulating layer on the first interlayer insulating layer.

3. The display device of claim 2, wherein the first groove and the third groove penetrate the second interlayer insulating layer, and wherein the second groove penetrates the second interlayer insulating layer, the first interlayer insulating layer, and the gate insulating layer.

4. The display device of claim 3, wherein the second groove further penetrates the buffer layer.

5. The display device of claim 4, wherein the first groove and the third groove further penetrate at least a portion of the first interlayer insulating layer, and the second groove further penetrates at least a portion of the barrier layer.

6. The display device of claim 5, further comprising:

a first gate electrode on the gate insulating layer and overlapping the first pixel area;

a second gate electrode on the gate insulating layer, overlapping the second pixel area, and connected to the first gate electrode;

a third gate electrode on the gate insulating layer and overlapping the third pixel area;

a fourth gate electrode on the gate insulating layer, overlapping the fourth pixel area, and connected to the third gate electrode;
a fifth gate electrode on the first interlayer insulating layer and overlapping the first pixel area;
a sixth gate electrode on the first interlayer insulating layer and overlapping the second pixel area;
a seventh gate electrode on the first interlayer insulating layer and overlapping the third pixel area; and
an eighth gate electrode on the first interlayer insulating layer and overlapping the fourth pixel area.

7. The display device of claim 6, further comprising:
a first conductive layer on the second interlayer insulating layer and overlapping the first pixel area;
a second conductive layer on the second interlayer insulating layer and overlapping the second pixel area;
a fifth conductive layer on the organic insulating layer, overlapping the main valley area, and connected to the second conductive layer through a first contact hole penetrating the organic insulating layer;
a third conductive layer on the second interlayer insulating layer, overlapping the third pixel area, and connected to the fifth conductive layer through a second contact hole penetrating the organic insulating layer; and
a fourth conductive layer on the second interlayer insulating layer and overlapping the fourth pixel area.

8. The display device of claim 1, wherein a width of the second groove is greater than a width of the first groove and a width of the third groove.

9. The display device of claim 1, wherein the second groove is to surround at least a portion of the plurality of pixel areas.

10. The display device of claim 1, wherein each of the inorganic insulating layer and the organic insulating layer is continuously formed over the plurality of pixel areas.

11. A display device comprising:
a substrate having a plurality of pixel areas comprising a first pixel area, a second pixel area offset from the first pixel area, a third pixel area offset from the second pixel area and a fourth pixel area offset from the third pixel area, and having a first sub valley area between the first pixel area and the second pixel area, a second sub valley area between the third pixel area and the fourth pixel area, and a main valley area between the second pixel area and the third pixel area;
an inorganic insulating layer on the substrate and defining a first groove, a third groove, and a second groove respectively overlapping the first sub valley area, the second sub valley area, and the main valley area, a depth of the second groove being different from a depth of the first groove;
an organic insulating layer on the inorganic insulating layer and filling the first groove, the second groove and the third groove; and
an etching prevention layer on a bottom surface of the second groove.

12. The display device of claim 11, wherein the inorganic insulating layer comprises a barrier layer, a buffer layer on the barrier layer, a gate insulating layer on the buffer layer, a first interlayer insulating layer on the gate insulating layer, and a second interlayer insulating layer on the first interlayer insulating layer.

13. The display device of claim 12, wherein the first groove and the third groove penetrate the second interlayer insulating layer, and
wherein the second groove penetrates the second interlayer insulating layer, the first interlayer insulating layer, and the gate insulating layer.

14. The display device of claim 13, wherein the second groove further penetrates the buffer layer.

15. The display device of claim 14, wherein the first groove and the third groove further penetrate at least a portion of the first interlayer insulating layer, and the second groove further penetrates at least a portion of the barrier layer.

16. The display device of claim 15, further comprising:
a first gate electrode on the gate insulating layer and overlapping the first pixel area;
a second gate electrode on the gate insulating layer, overlapping the second pixel area, and connected to the first gate electrode;
a third gate electrode on the gate insulating layer and overlapping the third pixel area;
a fourth gate electrode on the gate insulating layer, overlapping the fourth pixel area, and connected to the third gate electrode;
a fifth gate electrode on the first interlayer insulating layer and overlapping the first pixel area;
a sixth gate electrode on the first interlayer insulating layer and overlapping the second pixel area;
a seventh gate electrode on the first interlayer insulating layer and overlapping the third pixel area; and
an eighth gate electrode on the first interlayer insulating layer and overlapping the fourth pixel area.

17. The display device of claim 16, further comprising:
a first conductive layer on the second interlayer insulating layer and overlapping the first pixel area;
a second conductive layer on the second interlayer insulating layer and overlapping the second pixel area;
a fifth conductive layer on the organic insulating layer, overlapping the main valley area, and connected to the second conductive layer through a first contact hole penetrating the organic insulating layer;
a third conductive layer on the second interlayer insulating layer and overlapping the second pixel area;
a third conductive layer on the second interlayer insulating layer, overlapping the third pixel area, and connected to the fifth conductive layer through a second contact hole penetrating the organic insulating layer; and
a fourth conductive layer on the second interlayer insulating layer and overlapping the fourth pixel area.

18. The display device of claim 11, wherein a width of the second groove is greater than a width of the first groove and a width of the third groove.

19. The display device of claim 11, wherein the second groove is to surround at least a portion of the plurality of pixel areas.

20. The display device of claim 11, wherein each of the inorganic insulating layer and the organic insulating layer is continuously formed over the plurality of pixel areas.

* * * * *